(12) United States Patent
Sinha

(10) Patent No.: US 6,586,043 B1
(45) Date of Patent: Jul. 1, 2003

(54) METHODS OF ELECTROLESS DEPOSITION OF NICKEL, METHODS OF FORMING UNDER BUMP METALLURGY, AND CONSTRUCTIONS COMPRISING SOLDER BUMPS

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/043,431

(22) Filed: Jan. 9, 2002

(51) Int. Cl.[7] .............................. B05D 5/12; B05D 3/10; B05D 1/36; B05D 1/18
(52) U.S. Cl. ...................... 427/123; 427/125; 427/304; 427/305; 427/404; 427/405; 427/437; 427/438; 427/443.1
(58) Field of Search .............................. 427/443.1, 304, 427/305, 404, 405, 437, 438, 123, 125

(56) References Cited

U.S. PATENT DOCUMENTS

| | | | | |
|---|---|---|---|---|
| 3,599,060 A | * | 8/1971 | Triggs et al. ................ 257/751 |
| 3,825,353 A | * | 7/1974 | Loro ........................... 257/735 |
| 5,147,692 A | * | 9/1992 | Bengston ..................... 427/438 |
| 5,587,336 A | | 12/1996 | Wang et al. |
| 5,753,304 A | * | 5/1998 | Tung ........................... 427/304 |
| 6,335,265 B1 | * | 1/2002 | Kosaki et al. .............. 438/462 |

* cited by examiner

Primary Examiner—Michael Barr
(74) Attorney, Agent, or Firm—Wells St. John P.S.

(57) ABSTRACT

The invention includes a method of electroless deposition of nickel over an aluminum-containing material. A mass is formed over the aluminum-containing material, with the mass predominantly comprising a metal other than aluminum. The mass is exposed to palladium, and subsequently nickel is electroless deposited over the mass. The invention also includes a method of electroless deposition of nickel over aluminum-containing materials and copper-containing materials. The aluminum-containing materials and copper-containing materials are both exposed to palladium-containing solutions prior to electroless deposition of nickel over the aluminum-containing materials and copper-containing materials. Additionally, the invention includes a method of forming a solder bump over an aluminum-containing material.

41 Claims, 2 Drawing Sheets

METHODS OF ELECTROLESS DEPOSITION OF NICKEL, METHODS OF FORMING UNDER BUMP METALLURGY, AND CONSTRUCTIONS COMPRISING SOLDER BUMPS

TECHNICAL FIELD

The invention pertains to methods of electroless deposition of nickel over aluminum-containing materials and copper-containing materials, and in particular embodiments pertains to methods of forming under bump metallurgy (UBM) for subsequent solder bumps.

BACKGROUND OF THE INVENTION

Conductive bumps are currently being utilized for connecting integrated circuitry associated with a semiconductor chip to other circuitry external of the integrated circuitry. Solder bumps are utilized in, for example, flip chip applications, multi-chip module applications, and chip scale packaging applications.

An exemplary solder bump construction is described with reference to FIG. 1. Specifically, FIG. 1 illustrates a fragment 10 of a semiconductor construction. Fragment 10 comprises a substrate 12 having a conductive layer 14 supported thereon. Substrate 12 can include a semiconductive material, such as, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Additionally, the terms "material" and "layer" are to be understood to encompass pluralities of materials and layers, as well as single materials and layers, unless specifically stated otherwise.

Conductive material 14 can comprise a metallic material, such as, for example, one or more of aluminum and copper. In particular applications, conductive material 14 comprises aluminum or copper.

Substrate 12 can further include various circuit components (not shown), such as, for example, capacitors and transistors; and additionally can include insulative materials. Conductive material 14 can electrically connect with various of the circuit components associated with substrate 12.

An adhesion layer 16 is formed over conductive material 14. Adhesion layer 16 comprises, for example, titanium; and is utilized to improve adhesion of a masking material to the conductive material 14. For instance, if conductive material 14 comprises aluminum, a titanium-containing adhesion layer 16 can improve adhesion of various masking materials (such as materials comprising polyamide or BCB) over the aluminum.

A masking layer 18 is formed over adhesion layer 16. Masking layer 18 can comprise, for example, polyamide or BCB materials (with BCB materials being materials derived from bisbenzocyclobutane chemistry). Masking layer 18 can be patterned by providing photoresist (not shown) over the masking layer, using photolithographic methods to pattern the photoresist, and subsequently transferring a pattern from the photoresist to layer 18 with an appropriate etch.

The patterning of masking layer 18 forms an opening 20 extending through patterned masking layer 18. Opening 20 is shown extending through adhesion layer 16 and to conductive material 14. The shown opening 20 can be formed by first patterning masking layer 18 to expose a portion of adhesion layer 16, and subsequently removing the exposed portion of adhesion layer 16 to extend the opening entirely through layer 16 and to conductive material 14.

A nickel-containing layer 22 is formed within opening 20 and over conductive material 14. Nickel-containing layer 22 can be formed by, for example, electroless deposition, which is also referred to as autocatalytic electrolytic deposition (AED). Prior to the electroless deposition of nickel-containing layer 22, aluminum-containing material 14 within opening 20 is cleaned, and then subjected to activation with a zinc-containing solution. Such activation forms a thin zinc-containing material (not shown) over aluminum-containing layer 14. Subsequently, nickel-containing layer 22 is formed on the thin zinc-containing material by reduction of nickel from a nickel salt. An exemplary chemistry for electroless deposition of zinc comprises reactions I and II.

I. 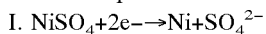
$NiSO_4 + 2e^- \rightarrow Ni + SO_4^{2-}$

II. 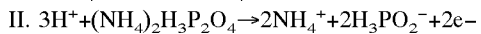
$3H^+ + (NH_4)_2 H_3 P_2 O_4 \rightarrow 2NH_4^+ + 2H_3PO_2^- + 2e^-$ After formation of nickel-containing layer 22, a gold-containing layer 24 is formed over nickel-containing layer 22. Gold-containing layer 24 can be formed by electroless deposition utilizing, for example, gold sulfide as a source of gold. The gold can be used as a wetting agent for subsequent solder formation.

It is noted that nickel-containing layer 22 can consist of, or consist essentially of, nickel; and that gold-containing layer 24 can consist of, or consist essentially of, gold.

A solder bump 26 is formed over gold-containing layer 24. Solder bump 26 can comprise, for example, a tin and/or lead-based solder.

The methodology described above is typical of what would be utilized for forming a solder bump over a layer 14 which comprises predominantly aluminum (i.e, comprises more than 50 atomic percent aluminum), consists essentially of aluminum, or consists of aluminum. If layer 14 comprises copper, the methodology will typically be somewhat different. For instance, adhesion layer 16 will typically be eliminated, and masking layer 18 will typically comprise butylcyclobutene (BCB). Further, a layer 14 which comprises predominantly copper, consists essentially of copper, or consists of copper, will typically be exposed to an activation solution which comprises palladium, instead of zinc, to form a thin layer of palladium (not shown) over layer 14. Subsequently, nickel-containing layer 22 will be formed over the thin layer of palladium utilizing the electroless chemistry described previously, and gold layer 24 will be formed over nickel-containing layer 22 utilizing electroless chemistry. Finally, solder bump 26 can be formed over gold layer 24.

It would be desirable to develop improved methods for forming electrical connections from solder bumps to conductive materials associated with semiconductor substrates.

SUMMARY OF THE INVENTION

In one aspect, the invention encompasses a method of electroless deposition of nickel over an aluminum-containing material. A mass is formed over the aluminum-containing material, with the mass predominantly comprising a metal other than aluminum. The mass is exposed to palladium, and subsequently nickel is electroless deposited over the mass.

In another aspect, the invention encompasses a method of electroless deposition of nickel over aluminum-containing materials and copper-containing materials. The aluminum-containing materials and copper-containing materials are both exposed to palladium-containing solutions prior to electroless deposition of nickel over the aluminum-containing materials and copper-containing materials.

In another aspect, the invention encompasses a method of forming a solder bump over a first material. The first material comprises one or both of aluminum and copper material. A titanium-containing material is formed over the first material, and a patterned mask is formed over the titanium-containing material. The patterned mask comprises polyamide and/or a BCB material, and has an opening extending therethrough to the titanium-containing material to expose a portion of the titanium-containing material. A palladium-containing material is formed on the exposed portion of the titanium-containing material. A nickel-containing material is electroless deposited on the palladium-containing material, and a gold-containing material is formed on the nickel-containing material. Finally, a solder bump is formed over the gold-containing material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
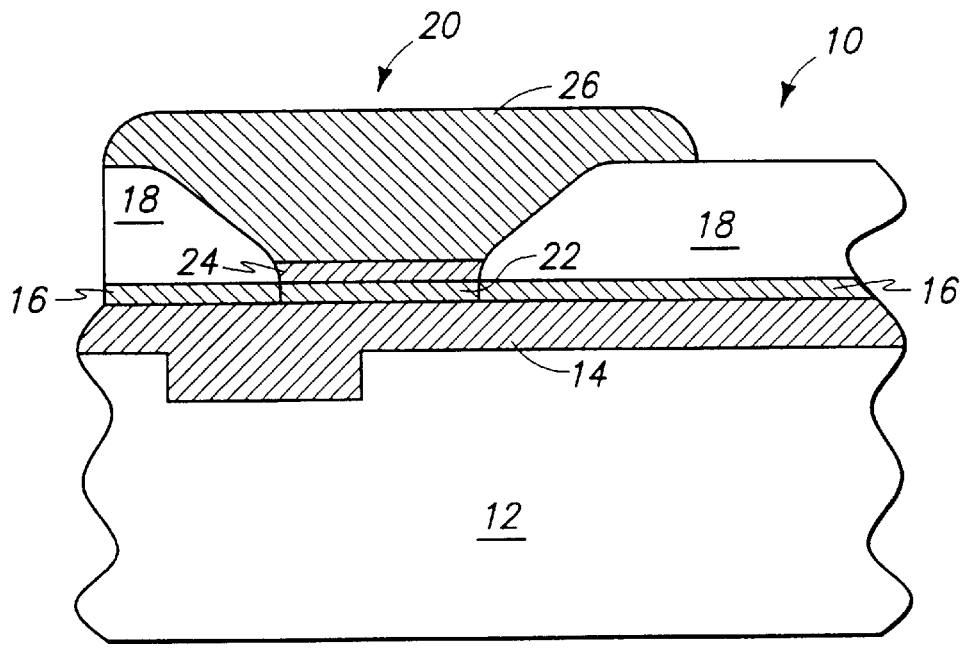
FIG. 1 is a diagrammatic, cross-sectional view of a semiconductor wafer fragment formed in accordance with the prior art.
Figure 2:
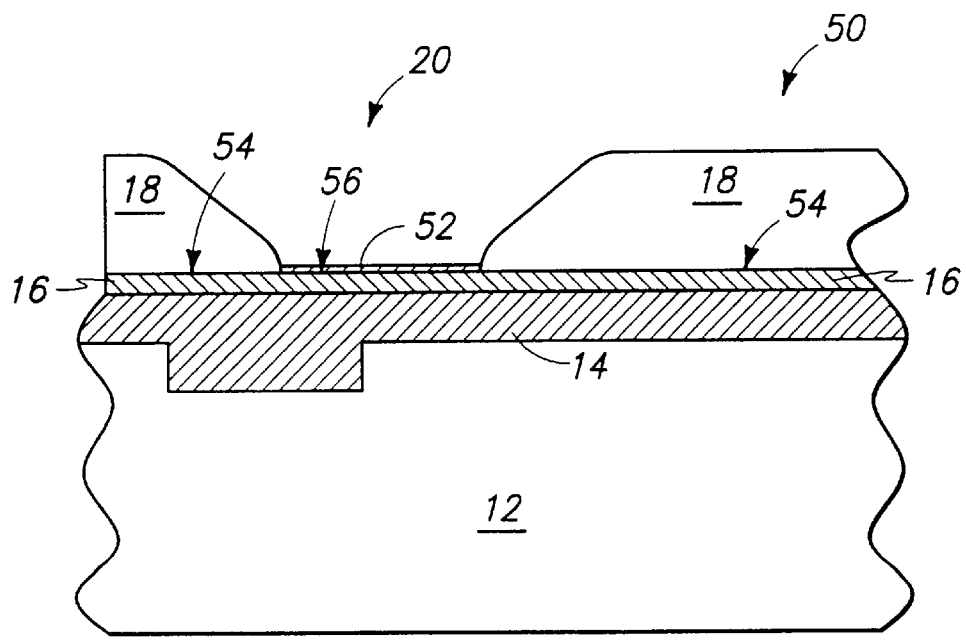
FIG. 2 is a diagrammatic, cross-sectional view of a semiconductor wafer fragment at a preliminary process step in accordance with a method of the present invention.
Figure 3:
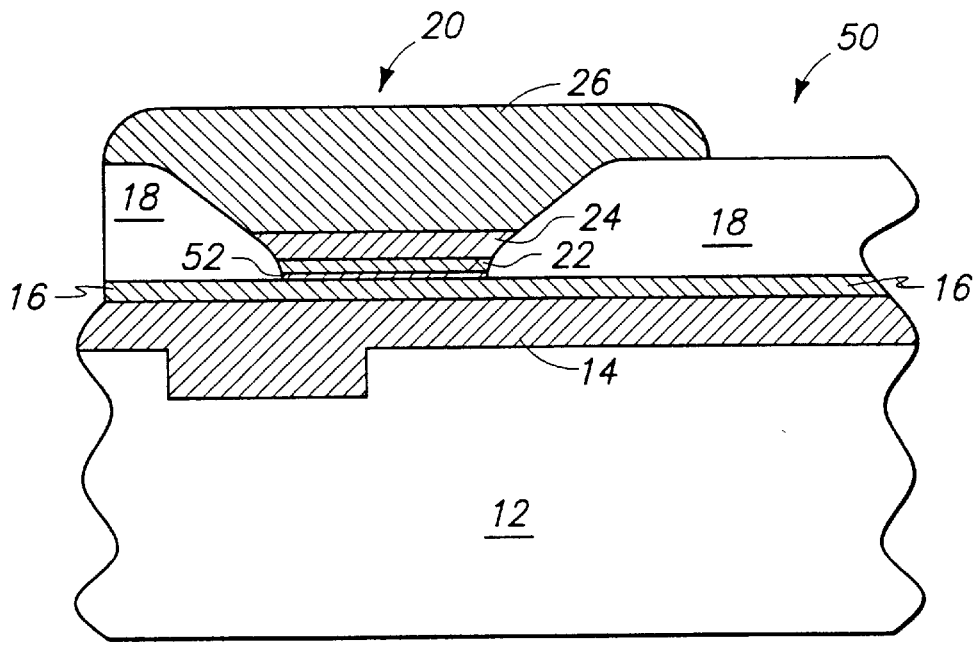
FIG. 3 is a view of the FIG. 2 wafer fragment shown at a process step subsequent to that of FIG. 2.

A method encompassed by the present invention is described initially with reference to FIGS. 2 and 3. In describing FIGS. 2 and 3, similar numbering will be utilized as was used above in describing the prior art of FIG. 1.

Referring to FIG. 2, a fragment 50 of a semiconductor wafer is illustrated. Fragment 50 comprises a substrate 12 having a conductive material 14 thereover. Conductive material 14 can comprise a metal, such as, for example, copper or aluminum. In the shown embodiment, material 14 is preferably an aluminum-containing material, such as, for example, a material which comprises predominantly aluminum, consists essentially of aluminum, or consists of aluminum.

A mass 16 is formed over aluminum-containing material 14. Mass 16 predominantly comprises a metal other than aluminum, and in particular embodiments can be a titanium-containing material. Such titanium-containing material can predominantly comprise titanium, consist essentially of titanium, or consist of titanium.

A masking layer 18 is formed over mass 16. Masking layer 18 can comprise, for example, polyamide or BCB, and can be patterned utilizing conventional methods. For instance, a patterned photoresist (not shown) can be formed over material 18, and subsequently a pattern transferred from the photoresist to material 18 with a suitable etch.

A thin palladium-containing layer 52 is formed over titanium-containing layer 16. Palladium-containing layer 52 can comprise, consist essentially of, or consist of palladium. Palladium-containing layer 52 will typically be an adsorbed monolayer.

It is noted that masking material 18 covers a portion 54 of titanium-containing layer 16, while leaving another portion 56 of titanium-containing layer 16 exposed. Palladium-containing layer 52 is formed over the exposed portion 56 of titanium-containing layer 16, and is not formed over the portions 54 which are covered by masking layer 18. It is further noted that some of the palladium of layer 52 can extend into layer 16, so that an interface between layers 52 and 16 will be more diffuse than is illustrated.

Palladium-containing layer 56 can be formed by exposing titanium-containing mass 16 to a solution comprising palladium and a halogen acid. An exemplary solution comprises from about 0.1 grams/liter to about 0.4 grams/liter $PdCl_2$ and from about 4 milliliters/liter to about 25 milliliter/liter of 49% HF, with the remaining portion of the solution being water. HCl can be utilized in addition to, or alternatively to, the HF. The exposure of mass 16 to the palladium-comprising solution is preferably for a time of from about 5 seconds to about 60 seconds, and at a temperature of about room temperature (i.e., from about 10° C. to about 30° C.).

Construction 50, like the prior art construction 10 of FIG. 1, comprises a masking layer 18 having an opening 20 extending therethrough. However, unlike the prior art construction 10 of FIG. 1, titanium-containing layer 16 remains within the opening 20 during formation of an activation layer (layer 52) over titanium-containing material 16. Further, a palladium-containing solution is utilized to form the activating layer over an aluminum-containing layer 14, in contrast to the prior art construction of FIG. 1 in which a zinc solution would be utilized for forming the activating layer relative to an aluminum-containing layer 14.

Referring to FIG. 3, a nickel-containing layer 22 is electroless deposited over palladium-containing layer 15, and a gold layer 24 is formed over nickel-containing layer 22. In the shown embodiment, palladium-containing layer 52 is physically against titanium-containing layer 16, nickel-containing layer 22 is physically against palladium-containing layer 52, and gold-containing layer 24 is physically against nickel-containing layer 22.

A solder bump 26 is formed over gold-containing layer 24.

An advantage of the processing of the present invention relative to prior art processes for electroless deposition of nickel over aluminum-,containing materials is that the process of the present invention can utilize a palladium-containing solution for activation over an aluminum-containing layer. Specifically, the prior art described with reference to FIG. 1 would utilize a zinc-containing solution to directly activate a surface of an aluminum-containing layer 14. In contrast, preferred methodology of the present invention provides a titanium-containing layer 16 over aluminum-containing layer 14, and subsequently utilizes a palladium-containing solution to activate the titanium-containing layer 16.

An advantage of utilizing a palladium-containing solution to activate relative to an aluminum-containing layer is that such enables the same palladium-containing solution to be utilized for activating relative to both aluminum-containing layers and copper-containing layers. Specifically, it was discussed relative to FIG. 1 that palladium-containing solutions can be utilized to directly activate copper-containing layers prior to electroless deposition of nickel over the copper-containing layers. Such is further illustrated with reference to FIG. 4 wherein a semiconductor construction 100 is illustrated. In referring to construction 100, similar numbering would be used as was utilized above in describing FIG. 1.

Construction 100 comprises a substrate 12, a copper-containing conductive layer 14, and a patterned masking layer 18. Patterned masking layer 18 can comprise, for example, butylcyclobutene. An opening 20 extends through masking layer 18 to a portion 104 of copper-containing material 14. A palladium-containing layer 102 is formed over exposed portion 104. Palladium-containing layer 102 can be considered an activating layer, and is formed by exposing fragment 100 to a palladium-containing solution. A nickel-containing layer 22 is electroless deposited over activating layer 104, a gold-containing layer 24 is formed over nickel-containing layer 22, and a solder bump 26 is formed over gold-containing layer 24.

Figure 4:
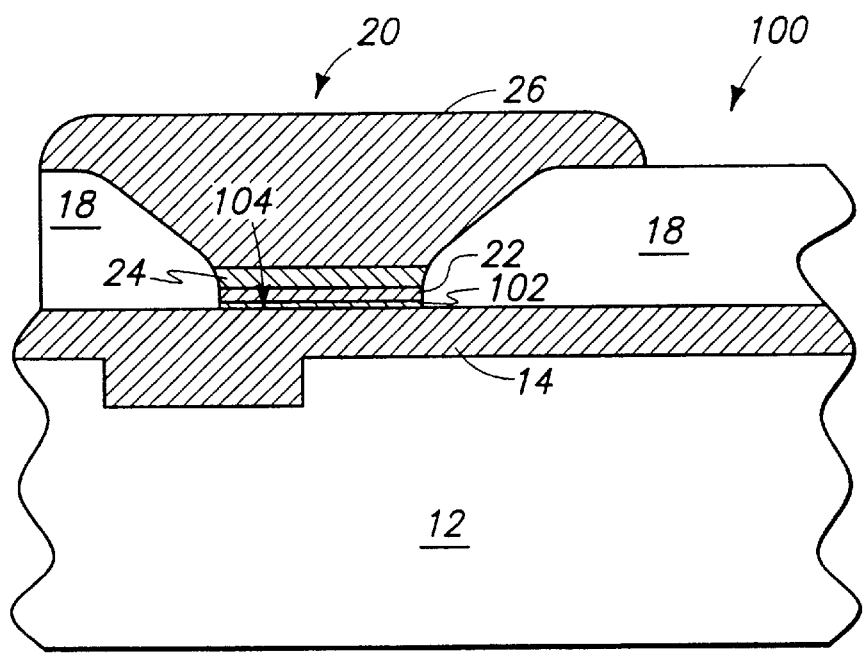
FIG. 4 is a diagrammatic, cross-sectional view of a semiconductor wafer fragment formed in accordance with another embodiment method of the present invention.

In preferred embodiments, the palladium-containing solution utilized for forming palladium-containing layer 102 of FIG. 4 will be identical to the solution described above with reference to FIGS. 2 and 3 for forming palladium-containing layer 52. Accordingly, the same solution can be utilized for activating relative to copper-containing materials as was utilized for activating relative to aluminum-containing materials.

An advantage of utilizing the same solution for activating relative to aluminum-containing layers and copper-containing layers is that such can reduce the number of processing solutions maintained at a semiconductor fabrication facility, and can save on tooling at the facilities, while maintaining throughput. Currently, semiconductor fabrication frequently involves electroless nickel deposition over both aluminum-containing wiring layers and copper-containing wiring layers. The prior art methodology of FIG. 1 utilizes a different activation solution for activating relative to the copper-containing layers than is utilized for activating relative to the aluminum-containing layers. Methodology of the present invention can enable a single solution to be maintained at a semiconductor production facility, and such solution can be utilized for activating relative to both aluminum-containing materials and copper-containing materials. In particular aspects of the invention, a palladium-containing solution is in a tank, and the copper-containing substrates and aluminum-containing substrates are treated by dipping the substrates into the tank. Titanium-containing layers can be formed over aluminum-containing materials of the aluminum-containing substrates prior to dipping the aluminum-containing substrates in the tank; and titanium-containing layers can also be formed over copper-containing materials of the copper-containing substrates prior to dipping the copper-containing substrates in the tank.

In other embodiments of the present invention, a separate solution can be utilized for activating relative to copper-containing materials than is used for activating relative to aluminum-containing, but both solutions can comprise palladium and a halogen acid. Accordingly, the solutions will comprise a similar or identical chemical constituents as one another, which can reduce a number of chemical constituents that are stocked at a semiconductor production facility. A difference between the solution utilized for activation relative to copper-containing layers and that utilized for activation relative to aluminum-containing layers can be in the concentration of palladium in one solution relative to the other, or in the concentration and/or type of halogen acid utilized in one solution relative to the other.

In embodiments in which a single common solution is utilized to activate relative to both aluminum-containing layers and copper-containing layers, methodology can be altered to accommodate different reaction rates relative to the copper-containing layers and the titanium-containing layers associated with aluminum-containing layers. Specifically, if the titanium-containing layers react more slowly with a particular palladium-containing activating solution than do copper-containing layers, the titanium-containing layers can be exposed to the solution for a longer period of time than are the copper-containing layers. Alternatively, if it is found that the copper-containing layers react more slowly than the titanium-containing layers, the copper-containing layers can be exposed to the palladium-containing activating solution for a longer period of time than are the titanium-containing layers.

A further aspect of the present invention is that a titanium mass can be provided over a copper-containing layer prior to exposure to an activating palladium solution. In such aspect of the invention, the methodology of FIGS. 2 and 3 can be applied to a construction in which layer 14 predominantly comprises copper, consists essentially of copper, or consists of copper. This aspect of the invention can be particularly advantageous in applications in which a single common palladium solution is utilized for activating relative to both aluminum-containing layers and copper-containing layers in that it can alleviate cross-contamination when switching from aluminum-containing layers to copper-containing layers and vice versa. Specifically, a material exposed to the palladium-containing activation solution will be a titanium-containing layer (16 of FIGS. 2 and 3), regardless of whether the activation is relative to a conductive material (14 of FIGS. 2 and 3) which is predominantly copper or aluminum. Also, the covering of both aluminum-containing conductive materials and copper-containing materials with a same composition of titanium prior to exposure to the palladium solution can enable identical palladium activation to be obtained relative to the copper-containing materials and aluminum-containing materials.

Another advantage of particular aspects of the present invention is that a number of processing steps can be reduced relative to prior art methods. Specifically, particular aspects of the present invention can eliminate formation of an opening (20 in FIG. 1) entirely through a titanium-containing layer (16 in FIG. 1).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of electroless deposition of nickel over a material comprising one or both of copper and aluminum, comprising:

forming a mass over the material, the mass predominantly comprising titanium;

exposing the mass to palladium; and after exposing the mass to palladium, electroless depositing nickel over the mass.

2. The method of claim 1 wherein the material predominantly comprises aluminum.

3. The method of claim 1 wherein the material consists essentially of aluminum.

4. The method of claim 1 wherein the material consists of aluminum.

5. The method of claim 1 wherein the material predominantly comprises copper.

6. The method of claim 1 wherein the material consists essentially of copper.

7. The method of claim 1 wherein the material consists of copper.

8. The method of claim 1 wherein the exposing the mass to palladium comprises exposing the mass to a solution comprising palladium and a halogen acid.

9. The method of claim 1 further comprising:
before exposing the mass to palladium, forming a masking layer over the mass; and
patterning the masking layer to leave a portion of the mass covered by the masking layer and another portion of the mass not covered by the masking layer, the exposing to the palladium comprising exposing only the portion of the mass which is not covered by the masking layer.

10. The method of claim 9 wherein the masking layer comprises polyamide.

11. The method of claim 9 wherein the masking layer comprises a BCB material.

12. The method of claim 1 wherein the exposing the mass to palladium comprises exposing the mass to a solution comprising palladium and a halogen acid for a time of from about 5 seconds to about 60 seconds.

13. The method of claim 1 wherein the exposing the mass to palladium comprises exposing the mass to a solution comprising palladium and a halogen acid for a time of from about 5 seconds to about 60 seconds, and at a temperature of from about 10° C. to about 30° C.

14. The method of claim 1 wherein the exposing the mass to palladium comprises exposing the mass to a solution comprising palladium and one or both of HF and HCl.

15. The method of claim 1 wherein the exposing the mass palladium comprises exposing the mass to a solution comprising from about 0.1 grams/liter to about 0.4 grams/liter $PdCl_2$, and from about 4 milliliters/liter to about 25 milliliters/liter of 49% HF.

16. A method of electroless deposition of nickels, comprising:
providing a substrate having an upper surface comprising a first material; the first material predominantly comprising aluminum or copper;
forming a titanium-containing material over the first material;
forming a palladium-containing material over the titanium-containing material; and
electroless depositing nickel on the palladium-containing material.

17. The method of claim 16 wherein the first material predominantly comprises aluminum.

18. The method of claim 16 wherein the first material predominantly comprises copper.

19. The method of claim 16 wherein the forming the palladium-containing material comprises exposing the titanium-containing material to a solution comprising palladium and a halogen acid.

20. The method of claim 16 wherein the forming the palladium-containing material comprises exposing the titanium-containing material to a solution comprising palladium and a halogen acid for a time of from about 5 seconds to about 60 seconds.

21. The method of claim 16 wherein the forming the palladium-containing material comprises exposing the titanium-containing material to a solution comprising palladium and a halogen acid for a time of from about 5 seconds to about 60 seconds, and at a temperature of from about 10° C. to about 30° C.

22. The method of claim 16 wherein the forming the palladium-containing material comprises exposing the titanium-containing material to a solution comprising palladium and one or both of HF and HCl.

23. The method of claim 16 wherein the forming the palladium-containing material comprises exposing the titanium-containing material to a solution comprising from about 0.1 grams/liter to about 0.4 grams/liter $PdCl_2$, and from about 4 milliliters/liter to about 25 milliliters/liter of 49% HF.

24. A method of electroless deposition of nickel over aluminum-containing materials and copper-containing materials, comprising:
providing a first substrate and a second substrate in a common semiconductor fabrication facility; the first substrate having a copper-containing material, and the second substrate having an aluminum-containing material;
forming a titanium-containing material over the aluminum-containing material of the second substrate;
exposing the first substrate to a first palladium-containing solution to form a first palladium-containing layer over the copper-containing material;
exposing the second substrate to a second palladium-containing solution to form a second palladium-containing layer over the titanium-containing material;
electroless depositing nickel on the first palladium-containing material to form a first nickel-containing material on the first palladium-containing material; and
electroless depositing nickel on the second palladium-containing material to form a second nickel-containing material on the second palladium-containing material.

25. The method of claim 24 wherein the copper-containing material of the first substrate is contacted with the first palladium-containing solution to form the first palladium-containing layer over the copper-containing material.

26. The method of claim 24 further comprising forming a titanium-containing material over the copper-containing material of the first substrate and exposing the titanium-containing material over the first substrate to the first palladium-containing solution to form the first palladium-containing layer over the copper-containing material.

27. The method of claim 24 wherein the first and second palladium-containing solutions are a single common solution.

28. The method of claim 24 wherein the first and second palladium-containing solutions are a single common solution in a tank, and wherein the exposing of the first and second substrates comprises dipping the first and second substrates into the tank.

29. The method of claim 24 wherein the first and second palladium-containing solutions are a single common solution which comprises palladium and a halogen acid.

30. The method of claim 24 wherein the first and second palladium-containing solutions are a single common solution which comprises palladium and one or both of HF and HCl.

31. The method of claim 24 wherein the first and second palladium-containing solutions are a single common solution which comprises from about 0.1 grams/liter to about 0.4 grams/liter PdCl$_2$, and from about 4 milliliters/liter to about 25 milliliters/liter of 49% HF.

32. The method of claim 24 wherein the first and second palladium-containing solutions are a single common solution, and wherein the first substrate is exposed to the common solution for a different length of time than the second substrate is exposed to the common solution.

33. The method of claim 24 wherein the first and second palladium-containing solutions are different solutions from one another.

34. The method of claim 24 wherein the first and second palladium-containing solutions are different solutions from one another, and comprise different concentrations of palladium relative to one another.

35. The method of claim 24 further comprising:
   forming a first gold-containing material over the first nickel-containing material;
   forming a second gold-containing material over the second nickel-containing material;
   forming a first solder bump over the first gold-containing material; and
   forming a second solder bump over the second gold-containing material.

36. A method of forming a solder bump over an aluminum-containing material, comprising:
   forming a titanium-containing material over the aluminum-containing material;
   forming a patterned mask over the titanium-containing material; the patterned mask comprising polyamide or a BCB material, and having an opening extending therethrough to the titanium-containing material to expose a portion of the titanium-containing material;
   forming a palladium-containing material on the exposed portion of the titanium-containing material;
   electroless depositing a nickel-containing material on the palladium-containing material;
   forming a gold-containing material on the nickel-containing material; and
   forming a solder bump over the gold-containing material.

37. The method of claim 36 wherein the forming the palladium-containing material comprises contacting the exposed portion of the titanium-containing material with a solution comprising palladium and a halogen acid.

38. The method of claim 36 wherein the forming the palladium-containing material comprises contacting the exposed portion of the titanium-containing material with a solution comprising palladium and a halogen acid for a time of from about 5 seconds to about 60 seconds.

39. The method of claim 36 wherein the forming the palladium-containing material comprises contacting the exposed portion of the titanium-containing material with a solution comprising palladium and a halogen acid for a time of from about 5 seconds to about 60 seconds, and at a temperature of from about 10° C. to about 30° C.

40. The method of claim 36 wherein the forming the palladium-containing material comprises contacting the exposed portion of the titanium-containing material with a solution comprising palladium and one or both of HF and HCl.

41. The method of claim 36 wherein the forming the palladium-containing material comprises contacting the exposed portion of the titanium-containing material with a solution comprising from about 0.1 grams/liter to about 0.4 grams/liter PdCl$_2$, and from about 4 milliliters/liter to about 25 milliliters/liter of 49% HF.

* * * * *

UNITED STATES PATENT AND TRADEMARK OFFICE
CERTIFICATE OF CORRECTION

PATENT NO. : 6,586,043 B1  Page 1 of 1
DATED : July 1, 2003
INVENTOR(S) : Nishant Sinha It is certified that error appears in the above-identified patent and that said Letters Patent is hereby corrected as shown below:

Column 4,
Line 50, replace "nickel over aluminum-, containing materials is that the" with
-- nickel over aluminum containing materials is that the --

Column 7,
Line 43, replace "A method of electroless of nickels," with -- A method of electroless of nickel, --

Column 8,
Line 10, replace "and one or both of HF and HCI" with -- and one or both of HF and HCl --

Signed and Sealed this

Fourteenth Day of October, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,586,043 B1  Page 1 of 1
DATED : July 1, 2003
INVENTOR(S) : Nishant Sinha It is certified that error appears in the above-identified patent and that said Letters Patent is hereby corrected as shown below:

<u>Column 2,</u>
Line 44, replace "butylcyclobutene (BCB). Further, a layer 14 which" with
-- BCB. Further, a layer 14 which --

Signed and Sealed this

Thirteenth Day of April, 2004

JON W. DUDAS
*Acting Director of the United States Patent and Trademark Office*